(12) United States Patent
Wang et al.

(10) Patent No.: US 11,893,938 B2
(45) Date of Patent: Feb. 6, 2024

(54) PIXEL CIRCUIT, DISPLAY PANEL AND DISPLAY APPARATUS

(71) Applicant: BOE Technology Group Co., Ltd., Beijing (CN)

(72) Inventors: Li Wang, Beijing (CN); Can Zheng, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 17/912,090

(22) PCT Filed: Feb. 9, 2021

(86) PCT No.: PCT/CN2021/076325
§ 371 (c)(1),
(2) Date: Sep. 16, 2022

(87) PCT Pub. No.: WO2021/185015
PCT Pub. Date: Sep. 23, 2021

(65) Prior Publication Data
US 2023/0186850 A1    Jun. 15, 2023

(30) Foreign Application Priority Data
Mar. 16, 2020 (CN) .......................... 202010182565.1

(51) Int. Cl.
*G09G 3/3233* (2016.01)
*H10K 59/131* (2023.01)

(52) U.S. Cl.
CPC ......... *G09G 3/3233* (2013.01); *H10K 59/131* (2023.02); *G09G 2300/0819* (2013.01);
(Continued)

(58) Field of Classification Search
CPC ......... G09G 3/3233; G09G 2300/0819; G09G 2300/0852; G09G 2310/0202;
(Continued)

(56) References Cited

U.S. PATENT DOCUMENTS

| 5,650,636 A | 7/1997 | Takemura et al. |
|---|---|---|
| 6,023,074 A | 2/2000 | Zhang |

(Continued)

FOREIGN PATENT DOCUMENTS

| CN | 106205490 A | 12/2016 |
|---|---|---|
| CN | 207352947 U | 5/2018 |

(Continued)

OTHER PUBLICATIONS

International Search Report and Written Opinion dated May 7, 2021, in corresponding PCT/CN2021/076325, 10 pages.
(Continued)

*Primary Examiner* — Michael J Jansen, II
(74) *Attorney, Agent, or Firm* — XSENSUS LLP

(57) ABSTRACT

Provided are a pixel circuit, a display panel and a display apparatus. The pixel circuit includes: a first resetting switching transistor, a first data writing switching transistor, a storage capacitor, a first compensation capacitor, a second compensation capacitor, and a driving transistor; the first resetting switching transistor includes a first switching sub-transistor and a second switching sub-transistor connected in series, and the first data writing switching transistor includes a third switching sub-transistor and a fourth switching sub-transistor connected in series. The first compensation capacitor and the second compensation capacitor are used to enable a voltage Vn1' of the first node to be smaller than a voltage Vn3' of the third node and larger than a voltage Vn4' of the fourth node in a light-emitting stage.

18 Claims, 4 Drawing Sheets

(52) U.S. Cl.
CPC ............... *G09G 2300/0852* (2013.01); *G09G 2310/0202* (2013.01); *G09G 2320/0247* (2013.01); *G09G 2360/16* (2013.01)

(58) Field of Classification Search
CPC ....... G09G 2320/0247; G09G 2360/16; G09G 2300/0842; G09G 2310/0251; G09G 2310/0262; G09G 2320/043; G09G 3/3266; G09G 3/3291; H10K 59/131
See application file for complete search history.

(56) References Cited

U.S. PATENT DOCUMENTS

| | | | |
|---|---|---|---|
| 6,259,117 B1 | 7/2001 | Takemura et al. | |
| 6,297,518 B1 | 10/2001 | Zhang | |
| 6,495,858 B1 | 12/2002 | Zhang | |
| 6,885,027 B2 | 4/2005 | Takemura et al. | |
| 7,148,506 B2 | 12/2006 | Zhang | |
| 7,459,724 B2 | 12/2008 | Zhang | |
| 8,575,602 B2* | 11/2013 | Noguchi | G09G 3/3233 257/40 |
| 8,587,578 B2* | 11/2013 | Choi | H05B 45/60 315/169.3 |
| 8,665,249 B2* | 3/2014 | Suh | G09G 3/3233 345/55 |
| 8,786,526 B2* | 7/2014 | Noguchi | G09G 3/3233 345/77 |
| 8,817,008 B2 | 8/2014 | Park et al. | |
| 9,355,594 B2* | 5/2016 | Lee | G09G 3/3233 |
| 9,378,675 B2* | 6/2016 | Kim | G09G 3/3233 |
| 9,384,700 B2* | 7/2016 | Chen | G09G 3/3291 |
| 9,412,299 B2* | 8/2016 | Miyazawa | G09G 3/3258 |
| 9,460,658 B2* | 10/2016 | Kim | G09G 3/3233 |
| 9,691,837 B2 | 6/2017 | Kim et al. | |
| 9,972,242 B2 | 5/2018 | Lim et al. | |
| 10,043,441 B2* | 8/2018 | Kim | G09G 3/3208 |
| 10,090,371 B2 | 10/2018 | Kim et al. | |
| 10,211,270 B2 | 2/2019 | Ha | |
| 10,566,406 B2 | 2/2020 | Kim et al. | |
| 10,825,880 B2* | 11/2020 | Hwang | G09G 3/3225 |
| 10,861,918 B2* | 12/2020 | Jeon | H01L 27/1259 |
| 10,885,847 B2 | 1/2021 | Wang et al. | |
| 11,158,262 B2* | 10/2021 | Gu | G09G 3/3266 |
| 11,309,373 B2* | 4/2022 | Kim | H10K 59/1213 |
| 11,335,247 B2* | 5/2022 | Bong | G09G 3/3233 |
| 11,348,992 B2* | 5/2022 | Oh | H10K 59/1213 |
| 11,386,854 B2* | 7/2022 | Kim | G09G 3/3233 |
| 11,404,519 B2* | 8/2022 | Moon | H10K 59/122 |
| 11,404,522 B2* | 8/2022 | Yun | H10K 59/1213 |
| 11,410,602 B2* | 8/2022 | Kim | G09G 3/3233 |
| 11,411,122 B2* | 8/2022 | Lee | H10K 59/12 |
| 11,569,327 B2* | 1/2023 | Kwak | G09G 3/3233 |
| 2003/0047733 A1* | 3/2003 | Takemura | G02F 1/13624 257/59 |
| 2005/0189541 A1 | 9/2005 | Zhang | |
| 2007/0091217 A1 | 4/2007 | Zhang | |
| 2009/0201231 A1* | 8/2009 | Takahara | G09G 3/3233 345/76 |
| 2010/0020059 A1* | 1/2010 | Suh | G09G 3/3233 345/212 |
| 2011/0157125 A1* | 6/2011 | Choi | G09G 3/3233 315/160 |
| 2011/0157144 A1* | 6/2011 | Park | G09G 3/3233 345/212 |
| 2012/0127220 A1* | 5/2012 | Noguchi | G09G 3/3233 345/77 |
| 2012/0199854 A1* | 8/2012 | Noguchi | H10K 59/131 257/E51.026 |
| 2014/0333686 A1* | 11/2014 | Kim | G09G 3/3233 345/82 |
| 2014/0353608 A1* | 12/2014 | Kim | G09G 3/3233 257/40 |
| 2015/0061538 A1* | 3/2015 | Miyazawa | G09G 3/3233 315/291 |
| 2015/0356924 A1* | 12/2015 | Chen | G09G 3/3291 345/77 |
| 2016/0055792 A1* | 2/2016 | Lee | G09G 3/3233 315/173 |
| 2016/0141350 A1* | 5/2016 | Kim | H10K 59/131 257/40 |
| 2016/0372037 A1* | 12/2016 | Lim | G09G 3/3233 |
| 2016/0379552 A1* | 12/2016 | Kim | G09G 3/3233 345/76 |
| 2017/0294503 A1 | 10/2017 | Kim et al. | |
| 2018/0151650 A1* | 5/2018 | Ha | H01L 29/78645 |
| 2019/0027552 A1 | 1/2019 | Kim et al. | |
| 2019/0123072 A1* | 4/2019 | Li | G09G 3/3648 |
| 2019/0206969 A1* | 7/2019 | Hwang | G09G 3/3225 |
| 2019/0259822 A1* | 8/2019 | Jeon | H01L 27/1218 |
| 2019/0304373 A1* | 10/2019 | Wang | H10K 59/126 |
| 2020/0066207 A1* | 2/2020 | Gu | G09G 3/3275 |
| 2020/0185487 A1 | 6/2020 | Kim et al. | |
| 2020/0365677 A1* | 11/2020 | Yun | H10K 59/1213 |
| 2020/0403059 A1* | 12/2020 | Oh | H10K 59/1213 |
| 2021/0036079 A1* | 2/2021 | Kim | H10K 59/123 |
| 2021/0134918 A1* | 5/2021 | Moon | H10K 59/131 |
| 2021/0175311 A1* | 6/2021 | Kwak | H10K 59/126 |
| 2021/0201766 A1* | 7/2021 | Bong | G09G 3/32 |
| 2021/0210014 A1* | 7/2021 | Kim | G09G 3/2007 |
| 2021/0249542 A1* | 8/2021 | Lee | H01L 29/78696 |
| 2021/0295784 A1* | 9/2021 | Kim | G09G 3/3291 |

FOREIGN PATENT DOCUMENTS

| | | |
|---|---|---|
| CN | 108122930 A | 6/2018 |
| CN | 108847186 A | 11/2018 |
| CN | 109979394 A | 7/2019 |
| CN | 110349997 A | 10/2019 |
| CN | 110648629 A | 1/2020 |
| CN | 110767163 A | 2/2020 |
| CN | 111179859 A | 5/2020 |
| CN | 110767163 B | 1/2021 |

OTHER PUBLICATIONS

Office Action dated Nov. 3, 2020, in corresponding Chinese patent Application No. 202010182565.1, 17 pages.

* cited by examiner

PIXEL CIRCUIT, DISPLAY PANEL AND DISPLAY APPARATUS

CROSS REFERENCE

The present disclosure is a National Stage of International Application No. PCT/CN2021/076325 filed on Feb. 9, 2021, which claims priority to Chinese Patent Application No. 202010182565.1 entitled "Pixel circuit, display panel and display apparatus", filed on Mar. 16, 2020, and both the entire contents of which are incorporated herein by reference.

TECHNICAL FIELD

The present disclosure relates to the field of display technology, and in particular, to a pixel circuit, a display panel and a display apparatus.

BACKGROUND

Organic Light Emitting Diode (OLED) is one of the hotspots in the research field of flat panel display today. Compared with Liquid Crystal Display (LCD), OLED display has the advantages of low energy consumption, low production cost, self-luminescence and wide viewing angle. and fast response. At present, OLED display has begun to replace traditional LCD display in fields of display such as mobile phone, tablet computer, and digital camera etc.

Unlike LCD, which uses a stable voltage to control brightness, OLED is current-driven and requires a stable current to control its light emitting. Among them, the basic functions of a pixel circuit in the active matrix organic electroluminescent diode (AMOLED) display are: refreshing the display signal at the beginning of the frame period, and maintaining a stable signal voltage during the frame period and apply it to the control port of the driving component by the storage capacitor Cst, for example, between the gate and the source of the driving TFT (DTFT), enabling the driving component stably outputting the driving current of the pixel OLED in the frame period.

SUMMARY

Embodiments of the present disclosure provide a pixel circuit, a display panel, and a display apparatus. The specific scheme is as follows.

According to a first aspect, there is provided a pixel circuit, including: a first resetting switching transistor, a first data writing switching transistor, a storage capacitor, a first compensation capacitor, a second compensation capacitor, and a driving transistor; the first resetting switching transistor includes a first switching sub-transistor and a second switching sub-transistor connected in series, and the first data writing switching transistor includes a third switching sub-transistor and a fourth switching sub-transistor connected in series; where, gates of the first switching sub-transistor and the second switching sub-transistor are both electrically connected to a first scanning signal line, a first electrode of the first switching sub-transistor is electrically connected to a first node, a first electrode of the second switching sub-transistor is electrically connected to a resetting signal line, and a second electrode of the first switching sub-transistor and a second electrode of the second switching sub-transistor are both electrically connected to a fourth node;

a gate of the driving transistor is electrically connected to the first node, and a first electrode of the driving transistor is electrically connected to a first power supply line;

gates of the third switching sub-transistor and the fourth switching sub-transistor are both electrically connected to a second scanning signal line, a first electrode of the third switching sub-transistor is electrically connected to the first node, and a first electrode of the fourth switching sub-transistor is electrically connected to a second electrode of the driving transistor, and a second electrode of the third switching sub-transistor and a second electrode of the fourth switching sub-transistor are both electrically connected to a third node;

the storage capacitor is electrically connected to the first power supply line and the first node respectively;

a first end of the first compensation capacitor is electrically connected to the first power supply line, and a second end of the first compensation capacitor is electrically connected to the third node;

a first end of the second compensation capacitor is electrically connected to the resetting signal line, and a second end of the second compensation capacitor is electrically connected to the fourth node;

the first compensation capacitor and the second compensation capacitor are used to enable a voltage Vn1' of the first node to be smaller than a voltage Vn3' of the third node and larger than a voltage Vn4' of the fourth node in a light-emitting stage.

In the pixel circuit according to some embodiments of the present disclosure, the first compensation capacitor and the second compensation capacitor are used to enable a difference between the voltage Vn3' of the third node and the voltage Vn1' of the first node is equal to a difference between the voltage Vn1' of the first node and the voltage Vn4' of the fourth node in the light-emitting stage.

In the pixel circuit according to some embodiments of the present disclosure, in the light-emitting stage:

$$Vn3'=(Vdt+Vth)+C3/(C3+C1+C_{n3\text{-}other})*\Delta V_{Sn};$$

$$Vn4'=V_{init}+C4/(C4+C2+C_{n4\text{-}other})*\Delta V_{Sn-1};$$

$$Vn1'=(Vdt+Vth)+C_{n1\text{-}sn}/(Cst+2*Cgd+C_{n1\text{-}other})*\Delta V_{Sn}+(C_{n1\text{-}n5}+Cgd)/(Cst+2*Cgd+C_{n1\text{-}other})*\Delta V_{Sn};$$

where, Vdt is a data voltage, Vth is a threshold voltage of the driving transistor, C3 is a parasitic capacitance between the third node and the second scanning signal line, C4 is parasitic capacitance between the fourth node and the first scanning signal line, C1 is a capacitance value of the first compensation capacitor, C2 is a capacitance value of the second compensation capacitor, $C_{n3\text{-}other}$ is a parasitic capacitance between the third node and another signal line, $C_{n4\text{-}other}$ is a parasitic capacitance between the fourth node and another signal line, $C_{n1\text{-}other}$ is a parasitic capacitance between the first node and another signal line, and $V_{init}$ is a resetting voltage on the resetting signal line, $\Delta V_{Sn}$ is a voltage difference on the second scanning signal line, $\Delta V_{Sn-1}$ is a voltage difference on the first scanning signal line, Cst is a capacitance value of the storage capacitor in the pixel circuit, $C_{n1\text{-}sn}$ is a parasitic capacitance between the gate of the driving transistor and the second scanning signal line, Cgd is a channel capacitance of the driving transistor, and $C_{n1\text{-}n5}$ is capacitance between the first node and the second electrode of the driving transistor, and $\Delta V_{n5}$ is a voltage difference between voltages of the second electrode of the driving transistor in the light-emitting stage and before the light-emitting stage.

In the pixel circuit according to some embodiments of the present disclosure, Vn1' is a fixed value, and the capacitance value of the first compensation capacitor C1 and the capacitance value of the second compensation capacitor C2 are determined based on Vn3'>Vn1'>Vn4'.

According to some embodiments of the present disclosure, the pixel circuit further includes an active layer, a first gate metal layer, a second gate metal layer and a source-drain metal layer;

the first end of the first compensation capacitor is the first power supply line located in the source-drain metal layer, the second end of the first compensation capacitor is arranged in a same layer as a conductive region of the active layer, the first gate metal layer, or the second gate metal layer.

In the pixel circuit according to some embodiments of the present disclosure, the first end of the second compensation capacitor is the resetting signal line located in the second gate metal layer, and the second end of the second compensation capacitor is arranged in a same layer as the conductive region of the active layer, the first gate metal layer or the source-drain metal layer.

In the pixel circuit according to some embodiments of the present disclosure, the second end of the first compensation capacitor and the second end of the second compensation capacitor are arranged in a same layer;

the second end of the first compensation capacitor is arranged in a same layer as the first gate metal layer or the second gate metal layer, the second end of the first compensation capacitor is electrically connected to the third node through a via hole, and the second end of the second compensation capacitor is electrically connected to the fourth node through a via hole.

The pixel circuit according to some embodiments of the present disclosure, further includes: a second data writing switching transistor, a second resetting switching transistor, a first light-emitting control switching transistor, a second light-emitting control switching transistor and a light-emitting device; where, a gate of the second data writing switching transistor is electrically connected to the second scanning signal line, a first electrode of the second data writing switching transistor is electrically connected to a data signal line, and a second electrode of the second data writing switching transistor is electrically connected to the first electrode of the driving transistor;

a gate of the second resetting switching transistor is electrically connected to the first scanning signal line, a first electrode of the second resetting switching transistor is electrically connected to the resetting signal line, a second electrode of the second resetting switching transistor is electrically connected to an anode of the light-emitting device, and a cathode of the light-emitting device is electrically connected to a second power supply line;

a gate of the first light-emitting control switching transistor is electrically connected to a light-emitting control signal line, a first electrode of the first light-emitting control switching transistor is electrically connected to the first electrode of the driving transistor, and a second electrode of the first light-emitting control switching transistor is electrically connected to the first power supply line; and a gate of the second light-emitting control switching transistor is electrically connected to the light-emitting control signal line, a first electrode of the second light-emitting control switching transistor is electrically connected to the second electrode of the driving transistor, and a second electrode of the second light-emitting control switching transistor is electrically connected to the anode of the light-emitting device.

In the pixel circuit according to some embodiments of the present disclosure, the driving transistor and all switching transistors are P-type transistors or N-type transistors.

According to a second aspect, there is provided a display panel, including the pixel circuit according to any one of embodiments of the present disclosure.

According to a third aspect, there is provided a display apparatus, including the display panel according to embodiments of the present disclosure.

DETAILED DESCRIPTION

In order to make the purpose, technical solutions and advantages of the present disclosure clearer, the specific implementations of the pixel circuit, the display panel and the display apparatus provided by the embodiments of the present disclosure will be described in detail below with reference to the accompanying drawings.

In the frame period between which the signal of the pixel circuit refreshes twice, the voltage holding ratio (VHR) of the storage capacitor Cst determines the stability and effective average value of the driving current of the pixel OLED, thus determining the stability and effective brightness of the pixel display luminescence. The leakage of the relevant loop formed by the switch TFT (STFT) in the pixel circuit has a direct impact on the signal voltage holding ratio in the storage capacitor Cst, thereby resulting in visual flicker.

Figure 1:
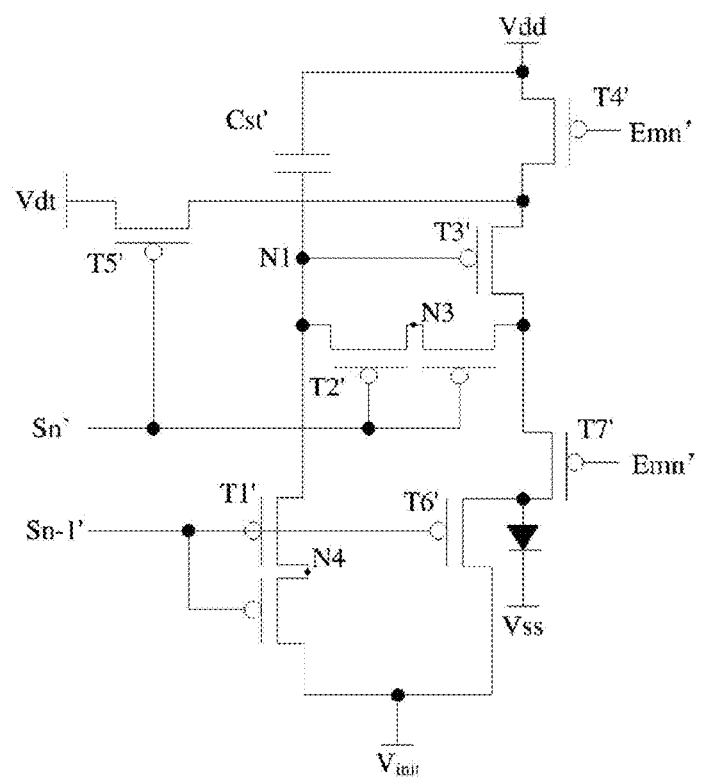
FIG. 1 is a schematic structural diagram of a pixel circuit in the related art.
Figure 2:
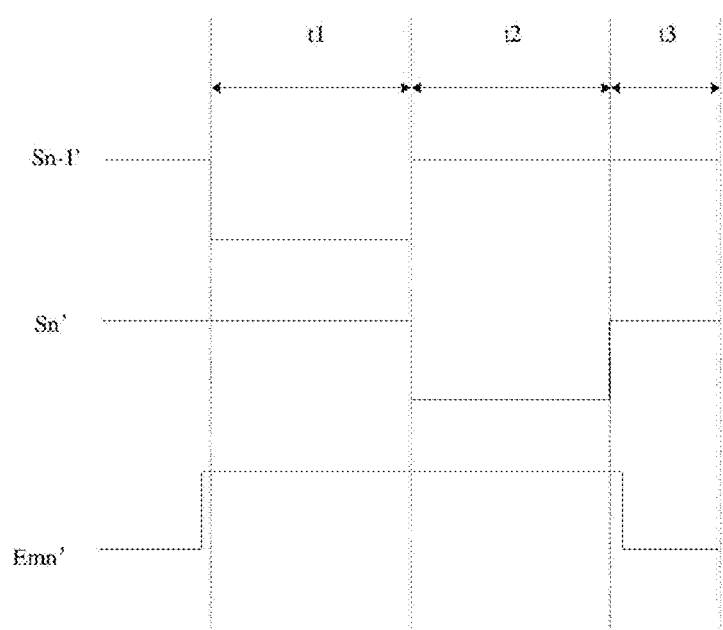
FIG. 2 is a schematic diagram of the working sequence of the pixel circuit.

At present, the pixel circuit of low temperature poly-silico (LTPS) AMOLED commonly used in related technologies, as shown in FIG. 1, includes six switching transistors (T1', T2', T4'-T7'), a driving transistor T3' and a storage capacitor Cst'. Usually, T1' and T2' adopt two TFTs connected in series to reduce leakage. When the first scanning signal line Sn-1' is at a low level, the gate N1 of the driving transistor T3' and the anode of the OLED are reset; when it is at a low level, the data voltage Vdt is written, at the same time, the threshold voltage Vth of the driving transistor T3' is obtained, and the voltage Vdt containing the data information on the data line Data is stored in the capacitor Cst'; when the light-emitting control signal line EMn' is at a low level, the OLED emits light, and the voltage of the first node N1 (OLED light-emitting stability) is maintained by the storage capacitor Cst'. As shown in FIG. 2, FIG. 2 is the working sequence diagram of FIG. 1, which includes a reset stage t1, a data writing stage t2, and a light-emitting stage t3. In the light-emitting stage t3, the intermediate node of TFTs connected in series in T1' and T2' is in a floating state. The main factors causing the nodes N3 and N4 to jump are: the first factor is the channel capacitance Cgs/Cgd existed in the T1' and T2'; the second factor is the parasitic capacitance inevitably existed between N3 and the second scanning signal line Sn' and between N4 and the first scanning signal line Sn-1'; the third is factor the parasitic capacitance generated between N3, N4 and other variable potential signal lines. Due to the existence of these parasitic capacitances, when Sn and Sn-1 jump from low level to high level (such as from −7V to +7V), the nodes N3 and N4 will be pulled to a higher potential. Therefore, the first node N1 has two leakage paths, which are caused by the potential jumping of the intermediate node of the transistors T1' and T2'. Leakage results in a change of the potential of the first node N1, and the display brightness fluctuates during the frame period, thereby generating a visual flicker.

Figure 3:
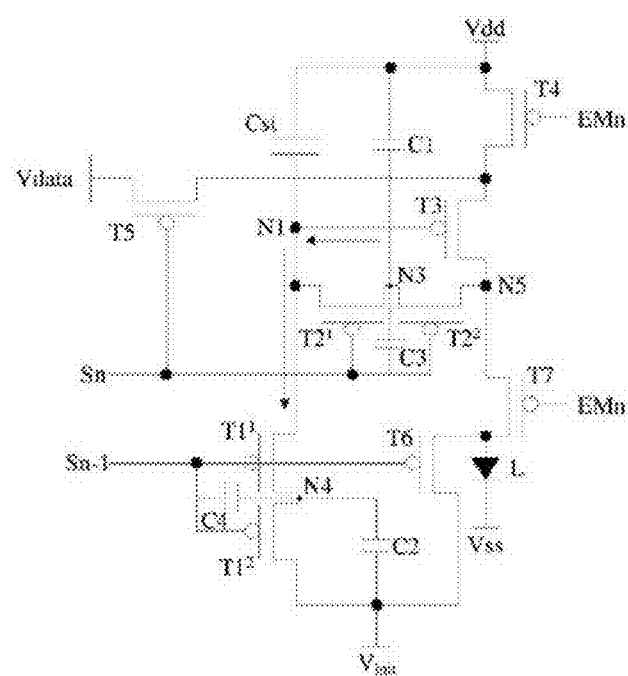
FIG. 3 is a schematic structural diagram of a pixel circuit according to embodiments of the present disclosure.

In view of this, there is provided a pixel circuit according to some embodiments of the present disclosure t. As shown in FIG. 3, the pixel circuit include: a first resetting switching transistor T1, a first data writing switching transistor T2, a storage capacitor Cst, a first compensation capacitor C1, a first compensation capacitors C2, a driving transistor T3; the first resetting switching transistor T1 includes a first switching sub-transistor $T1^1$ and a second switching sub-transistor $T1^2$ connected in series, and the first data writing switching transistor T2 includes a third switching sub-transistor $T2^1$ and a fourth switching sub-transistor $T2^2$ connected in series. It can reduce the leakage current of the first data writing switching transistor T2 and the first resetting switching transistor T1 and reduce the area of the pixel circuit. The first data writing switching transistor T2 and the first resetting switching transistor T1 can also be ordinary switching transistors.

The gates of the first switching sub-transistor $T1^1$ and the second switching sub-transistor $T1^2$ are both electrically connected to the first scanning signal line Sn-1, the first electrode of the first switching sub-transistor $T1^1$ is electrically connected to the first node N1, and the first electrode of the second switching sub-transistor $T1^1$ is electrically connected to the resetting signal line $V_{init}$, and the second electrode of the first switching sub-transistor $T1^1$ and the second electrode of the second switching sub-transistor $T1^2$ are both electrically connected to the fourth node N4.

The gate of the driving transistor T3 is electrically connected to the first node N1, and the first electrode of the driving transistor T3 is electrically connected to the first power supply line Vdd.

The gates of the third switching sub-transistor $T2^1$ and the fourth switching sub-transistor $T2^2$ are both electrically connected to the second scanning signal line Sn, the first electrode of the third switching sub-transistor $T2^1$ is electrically connected to the first node N1, and the first electrode of the fourth switching sub-transistor $T2^2$ is electrically connected to the second electrode of the driving transistor T3, and the second electrode of the third switching sub-transistor $T2^1$ and the second electrode of the fourth switching sub-transistor $T2^2$ are both electrically connected to the third node N3.

The storage capacitor Cst is electrically connected to the first power supply line Vdd and the first node N1 respectively.

The first end of the first compensation capacitor C1 is electrically connected to the first power supply line Vdd, and the second end of the first compensation capacitor C1 is electrically connected to the third node N3.

The first end of the second compensation capacitor C2 is electrically connected to the resetting signal line $V_{init}$, and the second end of the second compensation capacitor C2 is electrically connected to the fourth node N4.

The first compensation capacitor C1 and the second compensation capacitor C2 are used to enable a voltage Vn1' of the first node N1 to be smaller than a voltage Vn3' of the third node N3 and larger than the voltage Vn4' of the fourth node N4 in the light-emitting stage.

In the above pixel circuit provided by the embodiments of the present disclosure, by adjusting the magnitude ratio of the first compensation capacitor and the second compensation capacitor added in the pixel circuit, the voltage of the third node and the voltage of the fourth node can be adjusted, so that the voltage of the third node is greater than the voltage of the first node, and the voltage of the fourth node is smaller than the voltage of the first node. Thereby, the third node reversely charges the first node, and the first node leaks to the fourth node. It can be achieved that the charging process of the first node is complementary to the leakage process, so that the potential of the first node is balanced, the leakage of the first node can be reduced, and the signal voltage holding ratio of the capacitor signal in the pixel circuit can be improved, thereby realizing flicker-free display and low-frame-frequency driving, and thus improving the display quality of a display product.

During the specific implementation, in the above pixel circuit provided by the embodiments of the present disclosure, as shown in FIG. 3, the first compensation capacitor C1 and the second compensation capacitor C2 are specifically used to enable the difference between the voltage Vn3' of the third node N3 and the voltage Vn1' of the first node N1 to be equal to the difference between the voltage Vn1' of the first node N1 and the voltage Vn4' of the fourth node N4 in the light-emitting stage. That is, Vn3'-Vn1'=Vn1'-Vn4'. In this way, the charging and leakage processes can be complementary to each other, and the charging and leakage can cancel each other out, so that the potential of the first node N1 reaches a balance, thereby further reducing the leakage of the first node N1, and further improving the display quality of display products.

It should be noted that the above-mentioned Vn3'-Vn1'=Vn1'-Vn4' in the embodiments of the present disclosure can be understood as being approximately equal, as long as Vn3' is greater than Vn1' and Vn4' is less than Vn1', the leakage reduction of the first node can be achieved. Of course, in order to minimize the leakage of the first node N1, it may be that Vn3'-Vn1'=Vn1'-Vn4'.

In specific implementation, in the above-mentioned pixel circuit provided by the embodiments of the present disclosure, as shown in FIG. 3, the voltage of each node in the light-emitting stage satisfies the following equations:

$$Vn3'=(Vdt+Vth)+C3/(C3+C1+C_{n3\text{-}other})*\Delta V_{Sn};$$

$$Vn4'=V_{init}+C4/(C4+C2+C_{n4\text{-}other})*\Delta V_{Sn-1};$$

$$Vn1'=(Vdt+Vth)+C_{n1\text{-}sn}/(Cst+2*Cgd+C_{n1\text{-}other})*\Delta V_{Sn}+ (C_{n1\text{-}n5}+Cgd)/(Cst+2*Cgd+C_{n1\text{-}other})*\Delta V_{n5};$$

Where, Vdt is a data voltage, Vth is a threshold voltage of the driving transistor, C3 is a parasitic capacitance between the third node and the second scanning signal line, C4 is a parasitic capacitance between the fourth node and the first scanning signal line, C1 is a capacitance value of the first compensation capacitor, C2 is a capacitance value of the second compensation capacitor, $C_{n3\text{-}other}$ is a parasitic capacitance between the third node and another signal line, $C_{n4\text{-}other}$ is a parasitic capacitance between the fourth node and another signal line, $C_{n1\text{-}other}$ is a parasitic capacitance between the first node and another signal line, and $V_{init}$ is a resetting voltage on the resetting signal line, $\Delta V_{Sn}$ is a voltage difference on the second scanning signal line, $\Delta V_{Sn-1}$ is a voltage difference on the first scanning signal line, Cst is a capacitance value of the storage capacitor in the pixel circuit, $C_{n1-sn}$ is a parasitic capacitance between the gate of the driving transistor and the second scanning signal line, Cgd is a channel capacitance of the driving transistor, and $C_{n1-n5}$ is capacitance between the first node and the second electrode of the driving transistor, and $\Delta V_{n5}$ is a voltage difference between voltages of the second electrode of the driving transistor in the light-emitting stage and before the light-emitting stage.

It should be noted that the above $\Delta V_{Sn}$ being the voltage difference on the second scanning signal line, refers to the voltage difference between the voltage on the second scanning signal line at a high level and the voltage on the second scanning signal line at a low level. In FIG. 3 according to embodiments of the present disclosure, all transistors are taken P-type transistors as examples for description. The P-type transistor is turned on at a low level and turned off at a high level, then $\Delta V_{Sn}$ is the difference between the high voltage and the low voltage on the second scanning signal line. For example, the high voltage on the second scanning signal line is 7V and the low voltage is −7V, then $\Delta V_{Sn}=14V$. In the specific implementation, all transistors in the pixel circuit of the embodiments of the present disclosure may also be N-type transistors. The N-type transistor is turned on at a high level, and is turned off at a low level, then $\Delta V_{Sn}$ is the difference between the low voltage and the high voltage on the second scanning signal line. For example, the high voltage on the second scanning signal line is 7V and the low voltage is −7V, then $\Delta V_{Sn}=-14V$.

Similarly, the above $\Delta V_{Sn-1}$ being the voltage difference on the first scanning signal line refers to the voltage difference between the voltage on the first scanning signal line at a high level and that at a low level.

In specific implementation, in the above-mentioned pixel circuit provided by the embodiments of the present disclosure, as shown in FIG. 3, Vn1' is a fixed value, and the capacitance value C1 of the first compensation capacitor and the capacitance value C2 of the second compensation capacitor are determined based on Vn3'>Vn1'>Vn4'.

Specifically, for an OLED product of a specific size, the layout design of its pixel circuit is theoretically fixed, therefore:

the parameters in the equation of Vn1'=(Vdt+Vth)+ $C_{n1-sn}/(Cst+2*Cgd+C_{n1-other})*\Delta V_{Sn}+(C_{n1-n5}+Cgd)/(Cst+2*Cgd+C_{n1-other})*\Delta V_{n5}$ are known. According to the formula Vn3'−Vn1'=Vn1'−Vn4', it can be determined that only C1 and C2 are variables in the formulas of Vn4' and Vn3'. Then, according to Vn3'−Vn1'=Vn1'−Vn4', the value range of C1 and C2 can be calculated, so that the values of C1 and C2 satisfying that Vn3' is greater than Vn1', Vn4' is less than Vn1', or Vn3'−Vn1'=Vn1'−Vn4' can be determined. And then, the first compensation capacitor C1 and the second compensation capacitor C2 with design capacitance values of C1 and C2 are added in the layout design of the pixel circuit, so that in the pixel circuit provided by the present disclosure, during the light-emitting stage, the node N1 can achieve a balance between charging and leakage, thereby reducing the leakage of the first node N1 and improving the display quality of the display product.

Figure 4:
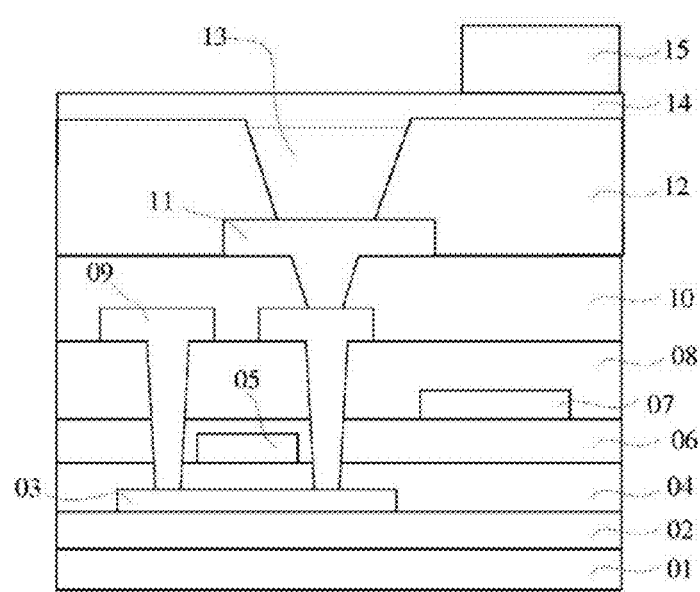
FIG. 4 is a schematic diagram of a film layer structure of the pixel circuit according to embodiments of the present disclosure.

In the specific implementation, in the above-mentioned pixel circuit provided by the embodiments of the present disclosure, as shown in FIG. 3 and FIG. 4, FIG. 4 is a schematic diagram of a circuit film layer structure corresponding to the pixel circuit shown in FIG. 3, which includes a base substrate 01, a buffer layer 02, an active layer 03, a first gate insulating layer 04, a first gate metal layer 05, a second gate insulating layer 06, a second gate metal layer 07, a interlayer dielectric layer 08, a source-drain metal layer 09, a planarization Layer 10, an anode layer 11, a pixel defining layer 12, a light-emitting layer 13, a cathode layer 14, and a spacer 15.

In some embodiments, the first power supply line Vdd (not shown in FIG. 4) is located in the source-drain metal layer 09, and the first end of the first compensation capacitor C1 is the first power supply line Vdd. That is, the first power supply line Vdd is reused as the first end of the first compensation capacitor. The second end of the first compensation capacitor C1 is arranged in a same layer as a conductive region (the region where the active layer is electrically connected to the source-drain electrode) of the active layer 03, the first gate metal layer 05, or the second gate metal layer 07.

Specifically, the area of the conductive region in the existing TFT active layer is fixed, and the present disclosure can increase the area of the conductive region of the existing TFT active layer. The increased existing TFT active layer and the first power supply line Vdd with the insulating layer between the two constitute the compensation capacitor C1; or in the present disclosure, a metal layer may be added to the first gate metal layer, and the added metal layer and the first power supply line Vdd with the insulating layer between the two constitute the first compensation capacitor C1; or in the present disclosure, a metal layer can be further added to the second gate metal layer, and the added metal layer and the first power supply line Vdd with the insulating layer between the two constitute the first compensation capacitor C1.

In some embodiments, the resetting signal line (not shown in FIG. 4) is located in the second gate metal layer 07. The first end of the second compensation capacitor C2 is the resetting signal line $V_{init}$. That is, the resetting signal line $V_{init}$ is reused as first end of the second compensation capacitor C2. The second end of the second compensation capacitor C2 is arranged in a same layer as the conductive region of the active layer, the first gate metal layer or the source-drain metal layer.

Specifically, the area of the conductive region of the existing TFT active layer is fixed, the present disclosure can increase the area of the conductive region of the existing TFT active layer. The increased existing TFT active layer and the resetting signal line $V_{init}$ with the insulating layer between the two constitute the second compensation capacitor C2; or in the present disclosure, a metal layer can be added to the first gate metal layer, and the added metal layer and the resetting signal line $V_{init}$ with the insulating layer between the two constitute the second compensation capacitor C2; or in the present disclosure, a metal layer can be added to the source-drain metal layer, and the added metal layer and the resetting signal line $V_{init}$ with the insulating layer between the two constitute the second compensation capacitor C2.

During specific implementation, in the above-mentioned pixel circuit provided by the embodiment of the present disclosure, as shown in FIG. 4, when the second end of the first compensation capacitor C1 and the second end of the second compensation capacitor C2 are both located at a same layer, and both located at a same layer as the first gate metal layer 05 or the second gate metal layer 07, the second end of the first compensation capacitor C1 is electrically connected to the third node N3 through a via hole, and the second end of the second compensation capacitor C2 is electrically connected to the fourth node N4 through a via hole. Specifically, since both the third node N3 and the fourth node N4 are located in the active layer, when both the second end of the first compensation capacitor C1 and the second end of the second compensation capacitor C2 are located in a same layer as the first gate metal layer 05, the second end of the first compensation capacitor C1 is electrically connected to the third node N3 through a via hole penetrating through the first gate insulating layer 04, and the second end of the second compensation capacitor C2 is electrically connected to the third node N4 through a via hole penetrating through the first gate insulating layer 04; when both the second end of the first compensation capacitor C1 and the second end of the second compensation capacitor C2 are located in a same layer as the second gate metal layer 07, the second end of the first compensation capacitor C1 is electrically connected to the third node N3 through via hole simultaneously penetrating through the first gate insulating layer 04 and the second insulating layer 06, and the second end of the second compensation capacitor C2 is electrically connected to the fourth node N4 through a via hole simultaneously penetrating through the first gate insulating layer 04 and the second insulating layer 06.

During specific implementation, the above-mentioned pixel circuit provided by the embodiment of the present disclosure, as shown in FIG. 3, further includes: a second data writing switching transistor T5, a second resetting switching transistor T6, a first light-emitting control switch T4, a second light-emitting control switch T7 and Light-emitting component L.

The gate of second data writing switching transistor T5 is electrically connected to the second scanning signal line Sn, the first electrode of the second data writing switching transistor T5 is electrically connected to the data signal line Vata, and the second electrode of the second data writing switching transistor T5 is electrically connected to the first electrode of the driving transistor T3.

The gate of the second resetting switching transistor T6 is electrically connected to the first scanning signal line Sn-1, the first electrode of the second resetting switching transistor T6 is electrically connected to the resetting signal line $V_{init}$, and the second electrode of the second resetting switching transistor T6 is electrically connected to the anode of the light-emitting device L; the cathode of the light-emitting device L is electrically connected to the second power supply line Vss.

The gate of the first light-emitting control switching transistor T4 is electrically connected to the light-emitting control signal line EMn, the first electrode of the first light-emitting control switching transistor T4 is electrically connected to the first electrode of the driving transistor T3, and the second electrode of the first light-emitting control switching transistor T4 is electrically connected to the first power supply line Vdd.

The gate of the second light-emitting control switching transistor T7 is electrically connected to the light-emitting control signal line EMn, the first electrode of the second light-emitting control switching transistor T7 is electrically connected to the second electrode of the driving transistor T3, and the second electrode of the second light-emitting control switching transistor T7 is electrically connected to the anode of the light-emitting device L.

In specific implementation, in the above-mentioned pixel circuit provided by the embodiments of the present disclosure, as shown in FIG. 3, the pixel circuit is generally used to drive the light-emitting device L to emit light, the light-emitting device L is generally an organic light-emitting diode (OLED), and the light-emitting device L emits light under the action of the current when the driving transistor T3 is in a saturated state. In addition, the light-emitting device L generally has a threshold voltage, and emits light when the voltage across the light-emitting device L is greater than or equal to the threshold voltage.

During specific implementation, in the above-mentioned pixel circuit provided by the embodiments of the present disclosure, as shown in FIG. 3, the voltage of the first power supply line Vdd is generally a high-level voltage, and the voltage of the second power supply line Vss is generally grounded or a low-level voltage.

During specific implementation, in the above pixel circuit provided by the embodiments of the present disclosure, the driving transistor is a P-type transistor. The principle that the driving transistor is an N-type crystal is similar to the principle that the driving transistor is a P-type transistor, and also belongs to the protection scope of the present disclosure.

During specific implementation, in the above-mentioned pixel circuit provided by the embodiments of the present disclosure, all switching transistors are P-type transistors or N-type transistors, which are not limited here.

Optionally, in the above pixel circuit provided by some embodiments of the present disclosure, as shown in FIG. 2, the driving transistor T3 and all the switching transistors T1, T2, T4-T7 are P-type transistors. In this way, only one type of transistor needs to be prepared, which can reduce process steps such as masks and photolithography, simplify the process flow, and save production costs.

During specific implementation, in the above pixel circuit provided by the embodiments of the present disclosure, the P-type switching transistor is turned on under the action of a low potential and turned off under the action of a high potential.

It should be noted that, in the above-mentioned pixel circuit provided by the embodiments of the present disclosure, the driving transistor and the switching transistors may be thin film transistors (TFT), or metal oxide semiconductors (MOS), which is not limited here.

During specific implementation, the functions of the first electrodes and the second electrodes of the switching transistors can be interchanged according to the type of the switching transistor and the signals at the signal ports, where the first electrode can be a source electrode, the second electrode can be a drain electrode, or the first electrode can be a drain electrode, and the second electrode may be the source electrode, which will not be specifically distinguished here.

Combining the pixel circuit as shown in FIG. 3 with the sequence as shown in FIG. 2, the working process of the pixel circuit provided by the embodiments of the present disclosure is as follows. In the resetting stage t1, the first scanning signal line Sn-1 outputs a low level, the second scanning signal line Sn and the light-emitting control signal Line EMn both output high levels, T5, T2$^1$, T2$^2$, T3, T4 and T7 are all turned off, T1$^1$, T1$^2$ and T6 are all turned on, and the gate of T3 and the anode of the light-emitting device L are reset through the resetting signal line $V_{init}$. In the data writing stage t2, the first scanning signal line Sn-1 outputs a high level, the second scanning signal line Sn outputs a low level, the light-emitting control signal line EMn outputs a high level, T1$^1$, T1$^2$, T6, T4 and T7 all output high levels, and T5, T3, T2$^1$ and T2$^2$ are all turned on. In this stage, the data signal Vdt writes data to the gate of T3, and maintains the write voltage through Cst. Since the data voltage Vdt is written to the its gate through T3, the threshold voltage Vth is also written at the same time, and this stage is also the threshold value Voltage compensation stage. In the light-emitting stage t3, the first scanning signal line Sn-1 and the second scanning signal line Sn both output high levels, the light-emitting control signal line EMn outputs a low level, T3, T4 and T7 are all turned on, and T1$^1$, T1$^2$, T6, T5, T2$^1$ and T2$^2$ are all turned off. The driving current is output to the light-emitting device L electrically connected to the second electrode of T7 through T4, T3 and T7 along the first power supply line Vdd, so as to drive the light-emitting device L to emit light.

In the three operation stages of the above-mentioned pixel circuit, in the light-emitting stage, the leakage of the first node N1 will occur, and the leakage will cause the potential of the first node N1 to change, so that the display brightness will fluctuate during the frame period, thereby producing visual flicker. Therefore, in the present disclosure, the first compensation capacitor C1 and the second compensation capacitor C2 are added in the pixel circuit. For OLED products of a specific size, the first compensation capacitor C1 with design capacitance value C1 and the second compensation capacitor C2 with design capacitance value C2 are added in the layout design of the pixel circuit, so that the charging and leakage of the first node N1 in the pixel circuit provided by the present disclosure can reach a balance during the light-emitting stage, thereby reducing the leakage of the first node N1 and improving the display quality of the display product.

The following will describe in detail how to design the first compensation capacitor C1 and the second compensation capacitor C2 through specific embodiments.

For a specific OLED product in some embodiments, the pixel circuit of the OLED product is shown in FIG. 3. When the first compensation capacitor C1 and the second compensation capacitor C2 provided by the embodiments of the present disclosure are added, the following equations are satisfied in the light-emitting stage:

$$Vn3'=(Vdt+Vth)+C3/(C3+C1+C_{n3\text{-}other})*\Delta V_{Sn};$$

$$Vn4'=V_{init}+C4/(C4+C2+C_{n4\text{-}other})*\Delta V_{Sn\text{-}1};$$

$$Vn1'=(Vdt+Vth)+C_{n1\text{-}sn}/(Cst+2*Cgd+C_{n1\text{-}other})*\Delta V_{Sn};$$

Since the OLED product includes a total of 256 (from 0-255) grayscales from low to high during display, in order to Vn3'−Vn1'=Vn1'−Vn4', the capacitance values of C1 and C2 respectively corresponding to a high grayscale and a low grayscale are inconsistent. This is due to the different voltage values of each node of the circuit under different grayscales. It indicates that, during design the leakage current should be balanced to the best state (i.e. Vn3'−Vn1'=Vn1'−Vn4') for a specific grayscale (e.g. a medium high grayscale L128), Vn3'>Vn1'>Vn4' can be satisfied in a large grayscale range, and the effect of overall leakage improvement can also be achieved. Therefore, in the design, a certain grayscale with higher voltage stability requirements will be selected for adjustment and optimization, such as L128 or L255. Therefore, when adjusting the potential balance of the first node N1, it is only necessary to adjust the potential of the first node N1 when a certain grayscale with higher voltage stability requirements is displayed, and calculate the first compensation capacitor C1 and the second compensation capacitor C2. For example:

When a high grayscale is selected, Vdt=2V, Vn3'=8.33V, Vn4'=6.33V, and Vn1'=0.27V, both Vn3' and Vn4' are higher than Vn1', resulting in that the first node N1 rises due to the leakage of T1$^1$ and T2$^1$;

(where: $\Delta Vsn = \Delta Vsn\text{-}1 = 14V, V_{init} = -3V, Cst = 60\ fF$,
$C_{n1\text{-}sn} = 2\ fF, C3 = C_{n3\text{-}sn} + 2*Cgd\text{-}T2 = 3\ fF, C4 =$
$C_{n4\text{-}sn\text{-}1} + 2*Cgd\text{-}T1 = 3\ fF, C_{n3\text{-}other} =$
$C_{n4\text{-}other} = C_{n1\text{-}other} = 2\ fF, Vth = -3V, Cst = 60\ fF$,
$Cgd\_T3 = 11.5\ fF, C_{n1\text{-}n5} = 1.5\ fF, \Delta Vn5 = 4V$).

It should be noted that since $C_{n3\text{-}other}$, $C_{n4\text{-}other}$ and $C_{n1\text{-}other}$ respectively represent the parasitic capacitance between the corresponding node and other signal lines in the pixel circuit (such as the resetting signal line, the first power supply line, etc.), and there are many signal lines in the pixel circuit, the values of $C_{n3\text{-}other}$, $C_{n4\text{-}other}$ and $C_{n1\text{-}other}$ are more complicated. In the present disclosure, for the convenience of calculation, the parasitic capacitance values of $C_{n3\text{-}other}$, $C_{n4\text{-}other}$ and $C_{n1\text{-}other}$ are set to be equal, that is, $C_{n3\text{-}other} = C_{n4\text{-}other} = C_{n1\text{-}other} = 2\ fF$.

When C1=11 fF, C2=38 fF, Vn3'=2.29V, Vn4'=−1.73V, Vn1'=0.27V, it is resulted in that Vn3'>Vn1'>Vn4' and Vn3'−Vn1'≈Vn1'−Vn4', so as to achieve leakage balance.

When a low grayscale is selected, Vdt=4V, Vn3'=10.33V, Vn4'=6.33V, and Vn1'=2.27V, both Vn3' and Vn4' are higher than Vn1', resulting in that the first node N1 rises due to the leakage of T1$^1$ And T2$^1$.

When C1=6 fF, C1=23 fF, Vn3'=5.67V, Vn4'=−1.07V, Vn1'=2.27V, it is resulted in that Vn3'>Vn1'>Vn4' and Vn3'−Vn1'≈Vn1'−Vn4', so as to achieve leakage balance.

The above calculations at a high grayscale and a low grayscale are theoretical derivations, only focusing on the main variables, ignoring many intermediate links, dynamic change processes, and parasitic effects between other nodes.

The working process of the pixel circuit provided by the embodiments of the present disclosure is simulated as below:

When the pixel circuit does not comprise the first compensation capacitor C1 and the second compensation capacitor C2, that is, when C1=C2=0 fF, under a high grayscale, Vn3'=6.91V, Vn4'=6.86V, Vn1'=0.6V, the voltages of the third node N3 and the fourth node N4 are both higher than the voltage of the first node N1, the first node N1 has serious leakage, and the Ioled frame change rate at 60 Hz is ≈16.2%; under a low grayscale, Vn3'=7.18V, Vn4'=7.16 V, Vn1'=2.21V, the voltages of the third node N3 and the fourth node N4 are also both greater than the voltage of the first node N1, the first node N1 has serious leakage, and the Ioled frame change rate at 60 Hz≈15.56%;

When the first compensation capacitor C1 and the second compensation capacitor C2 are added in the pixel circuit of the present disclosure, for example, under a high grayscale, when C1=5.5 fF and C2=20 fF, Vn3'=2.5V, Vn4'=−1.74V, Vn1'=0.4V, Vn3'−Vn1'≈Vn1'−Vn4', Ioled frame change rate at 60 Hz≈0.28%; under a low grayscale, when C1=3 fF and C2=11 fF, Vn3'=5.19V, Vn4'=−0.92V, Vn1'=2.09V, Vn3'−Vn1'≈Vn1'−Vn4', Ioled frame change rate at 60 Hz≈5.66%. Although the current is lower, and the change rate seems to be slightly larger, the amount of change is small and the visual sense is not obvious.

The above are simple simulation results, only focusing on the main parameters, which are only used to illustrate the problem and do not represent the actual design situation. In addition, the theoretical derivation and circuit simulation are carried out in the most favorable way to illustrate the problem. Due to the omission and simplification of related processes and parameters, there are errors between the two.

Based on the same inventive concept, embodiments of the present disclosure further provide a display panel, including: any one of the above pixel circuits provided by the embodiments of the present disclosure. The principle of solving the problem of the display panel is similar to that of the aforementioned pixel circuit, so the implementation of the display panel can refer to the implementation of the above-mentioned pixel circuit, and the repetition will not be repeated.

During specific implementation, in the above-mentioned display panel provided by the embodiments of the present disclosure, the display panel may be an organic electroluminescence display panel.

Based on the same inventive concept, embodiments of the present disclosure further provide a display apparatus, including the above-mentioned display panel provided by embodiments of the present disclosure. The display apparatus can be any product or component with a display function, such as a mobile phone, a tablet computer, a TV, a monitor, a notebook computer, a digital photo frame, a navigator, and the like. Other essential components of the display apparatus should be understood by those of ordinary skills in the art, and will not be repeated here, nor should it be regarded as a limitation of the present disclosure. For the implementation of the display apparatus, reference may be made to the above-mentioned embodiments of the pixel circuit, and repeated descriptions will not be repeated.

The pixel circuit, the display panel and the display apparatus provided by the embodiments of the present disclosure include: a first resetting switching transistor, a first data writing switching transistor, a first compensation capacitor, a second compensation capacitor, and a driving transistor; where, the first resetting switching transistor includes a first switching sub-transistor and a second switching sub-transistor connected in series, the first data writing switching transistor includes a third switching sub-transistor and a fourth switching sub-transistor connected in series; the first compensation capacitor and the second compensation capacitor are used to enable the voltage of the third node to be larger than the voltage of the first node and the voltage of the fourth node to be smaller than the voltage of the first node in the light-emitting stage. In the pixel circuit provided by the present disclosure, the first compensation capacitor and the second compensation capacitor are added to adjust the voltage of the third node and the voltage of the fourth node by adjusting the magnitude ratio of the first compensation capacitor and the second compensation capacitor, so that the voltage of the third node is greater than the voltage of the first node, and the voltage of the fourth node is less than the voltage of the first node. In this way, the third node charges the first node in reverse, and the first node leaks to the fourth node, so that the charging process can be complementary to the leakage process of the first node, the potential of the first node is balanced, leakage of the first node can be reduced, the signal voltage holding ratio of the storage capacitor in the pixel circuit can be improved, and flicker-free display and low-frame-frequency driving can be realized, thereby improving the display quality of the display product.

It will be apparent to those skilled in the art that various modifications and variations can be made to the present disclosure without departing from the spirit and scope of the disclosure. Thus, provided that these modifications and variations of the present disclosure fall within the scope of the claims of the present disclosure and their equivalents, the present disclosure is also intended to include these modifications and variations.

What is claimed is:

1. A pixel circuit, comprising: a first resetting switching transistor, a first data writing switching transistor, a storage capacitor, a first compensation capacitor, a second compensation capacitor, and a driving transistor; wherein the first resetting switching transistor comprises a first switching sub-transistor and a second switching sub-transistor connected in series, and the first data writing switching transistor comprises a third switching sub-transistor and a fourth switching sub-transistor connected in series; wherein, gates of the first switching sub-transistor and the second switching sub-transistor are both electrically connected to a first scanning signal line, a first electrode of the first switching sub-transistor is electrically connected to a first node, a first electrode of the second switching sub-transistor is electrically connected to a resetting signal line, and a second electrode of the first switching sub-transistor and a second electrode of the second switching sub-transistor are both electrically connected to a fourth node;

a gate of the driving transistor is electrically connected to the first node, and a first electrode of the driving transistor is electrically connected to a first power supply line;

gates of the third switching sub-transistor and the fourth switching sub-transistor are both electrically connected to a second scanning signal line, a first electrode of the third switching sub-transistor is electrically connected to the first node, and a first electrode of the fourth switching sub-transistor is electrically connected to a second electrode of the driving transistor, and a second electrode of the third switching sub-transistor and a second electrode of the fourth switching sub-transistor are both electrically connected to a third node;

the storage capacitor is electrically connected to the first power supply line and the first node respectively;

a first end of the first compensation capacitor is electrically connected to the first power supply line, and a second end of the first compensation capacitor is electrically connected to the third node;

a first end of the second compensation capacitor is electrically connected to the resetting signal line, and a second end of the second compensation capacitor is electrically connected to the fourth node;

the first compensation capacitor and the second compensation capacitor are used to enable a voltage Vn1' of the first node to be smaller than a voltage Vn3' of the third node and larger than a voltage Vn4' of the fourth node in a light-emitting stage;

wherein the pixel circuit further comprises an active layer, a first gate metal layer, a second gate metal layer and a source-drain metal layer;

the first end of the first compensation capacitor is the first power supply line located in the source-drain metal layer, the second end of the first compensation capacitor is arranged in a same layer as a conductive region of the active layer, the first gate metal layer, or the second gate metal layer.

2. The pixel circuit according to claim 1, wherein the first compensation capacitor and the second compensation capacitor are used to enable a difference between the voltage Vn3' of the third node and the voltage Vn1' of the first node is equal to a difference between the voltage Vn1' of the first node and the voltage Vn4' of the fourth node in the light-emitting stage.

3. The pixel circuit of claim 2, wherein in the light-emitting stage:

$$Vn3'=(Vdt+Vth)+C3/(C3-C1+C_{n3\text{-}other})*\Delta V_{Sn};$$

$$Vn4'=V_{init}+C4/(C4+C2+C_{n4\text{-}other})*\Delta V_{Sn-1};$$

$$Vn1'=(Vdt+Vth)+C_{n1\text{-}sn}/(Cst+2*Cgd+C_{n1\text{-}other})*\Delta V_{Sn}+ (C_{n1\text{-}n5}+Cgd)/(Cst+2*Cgd+C_{n1\text{-}other})*\Delta V_{n5};$$

wherein, Vdt is a data voltage, Vth is a threshold voltage of the driving transistor, C3 is a parasitic capacitance between the third node and the second scanning signal line, C4 is parasitic capacitance between the fourth node and the first scanning signal line, C1 is a capacitance value of the first compensation capacitor, C2 is a capacitance value of the second compensation capacitor, $C_{n3\text{-}other}$ is a parasitic capacitance between the third node and another signal line, $C_{n4\text{-}other}$ is a parasitic capacitance between the fourth node and another signal line, $C_{n1\text{-}other}$ is a parasitic capacitance between the first node and another signal line, and $V_{init}$ is a resetting voltage on the resetting signal line, $\Delta V_{Sn}$ is a voltage difference on the second scanning signal line, $\Delta V_{Sn-1}$ is a voltage difference on the first scanning signal line, Cst is a capacitance value of the storage capacitor in the pixel circuit, $C_{n1\text{-}sn}$ is a parasitic capacitance between the gate of the driving transistor and the second scanning signal line, Cgd is a channel capacitance of the driving transistor, and $C_{n1\text{-}n5}$ is capacitance between the first node and the second electrode of the driving transistor, and $\Delta V_{n5}$ is a voltage difference between voltages of the second electrode of the driving transistor in the light-emitting stage and before the light-emitting stage.

4. The pixel circuit according to claim 1, wherein Vn1' is a fixed value, and the capacitance value of the first compensation capacitor C1 and the capacitance value of the second compensation capacitor C2 are determined based on Vn3'>Vn1'>Vn4'.

5. The pixel circuit of claim 1, wherein the first end of the second compensation capacitor is the resetting signal line located in the second gate metal layer, and the second end of the second compensation capacitor is arranged in a same layer as the conductive region of the active layer, the first gate metal layer or the source-drain metal layer.

6. The pixel circuit according to claim 5, wherein the second end of the first compensation capacitor and the second end of the second compensation capacitor are arranged in a same layer; and
the second end of the first compensation capacitor is arranged in a same layer as the first gate metal layer or the second gate metal layer, the second end of the first compensation capacitor is electrically connected to the third node through a via hole, and the second end of the second compensation capacitor is electrically connected to the fourth node through a via hole.

7. The pixel circuit according to claim 1, further comprising: a second data writing switching transistor, a second resetting switching transistor, a first light-emitting control switching transistor, a second light-emitting control switching transistor and a light-emitting device; wherein,
a gate of the second data writing switching transistor is electrically connected to the second scanning signal line, a first electrode of the second data writing switching transistor is electrically connected to a data signal line, and a second electrode of the second data writing switching transistor is electrically connected to the first electrode of the driving transistor;
a gate of the second resetting switching transistor is electrically connected to the first scanning signal line, a first electrode of the second resetting switching transistor is electrically connected to the resetting signal line, a second electrode of the second resetting switching transistor is electrically connected to an anode of the light-emitting device, and a cathode of the light-emitting device is electrically connected to a second power supply line;
a gate of the first light-emitting control switching transistor is electrically connected to a light-emitting control signal line, a first electrode of the first light-emitting control switching transistor is electrically connected to the first electrode of the driving transistor, and a second electrode of the first light-emitting control switching transistor is electrically connected to the first power supply line; and
a gate of the second light-emitting control switching transistor is electrically connected to the light-emitting control signal line, a first electrode of the second light-emitting control switching transistor is electrically connected to the second electrode of the driving transistor, and a second electrode of the second light-emitting control switching transistor is electrically connected to the anode of the light-emitting device.

8. The pixel circuit according to claim 7, wherein the driving transistor and all switching transistors are P-type transistors or N-type transistors.

9. A display panel, comprising a pixel circuit, wherein the pixel circuit comprises: a first resetting switching transistor, a first data writing switching transistor, a storage capacitor, a first compensation capacitor, a second compensation capacitor, and a driving transistor; wherein the first resetting switching transistor comprises a first switching sub-transistor and a second switching sub-transistor connected in series, and the first data writing switching transistor comprises a third switching sub-transistor and a fourth switching sub-transistor connected in series; wherein,
gates of the first switching sub-transistor and the second switching sub-transistor are both electrically connected to a first scanning signal line, a first electrode of the first switching sub-transistor is electrically connected to a first node, a first electrode of the second switching sub-transistor is electrically connected to a resetting signal line, and a second electrode of the first switching sub-transistor and a second electrode of the second switching sub-transistor are both electrically connected to a fourth node;
a gate of the driving transistor is electrically connected to the first node, and a first electrode of the driving transistor is electrically connected to a first power supply line;
gates of the third switching sub-transistor and the fourth switching sub-transistor are both electrically connected to a second scanning signal line, a first electrode of the third switching sub-transistor is electrically connected to the first node, and a first electrode of the fourth switching sub-transistor is electrically connected to a second electrode of the driving transistor, and a second electrode of the third switching sub-transistor and a second electrode of the fourth switching sub-transistor are both electrically connected to a third node;
the storage capacitor is electrically connected to the first power supply line and the first node respectively;
a first end of the first compensation capacitor is electrically connected to the first power supply line, and a second end of the first compensation capacitor is electrically connected to the third node;
a first end of the second compensation capacitor is electrically connected to the resetting signal line, and a second end of the second compensation capacitor is electrically connected to the fourth node;
the first compensation capacitor and the second compensation capacitor are used to enable a voltage Vn1' of the first node to be smaller than a voltage Vn3 of the third node and larger than a voltage Vn4' of the fourth node in a light-emitting stage;

wherein the pixel circuit further comprises an active layer, a first gate metal layer, a second gate metal layer and a source-drain metal layer;

the first end of the first compensation capacitor is the first power supply line located in the source-drain metal layer, the second end of the first compensation capacitor is arranged in a same layer as a conductive region of the active layer, the first gate metal layer, or the second gate metal layer.

10. A display apparatus, comprising a display panel, wherein the display panel comprises a pixel circuit, and the pixel circuit comprises: a first resetting switching transistor, a first data writing switching transistor, a storage capacitor, a first compensation capacitor, a second compensation capacitor, and a driving transistor; wherein the first resetting switching transistor comprises a first switching sub-transistor and a second switching sub-transistor connected in series, and the first data writing switching transistor comprises a third switching sub-transistor and a fourth switching sub-transistor connected in series; wherein, gates of the first switching sub-transistor and the second switching sub-transistor are both electrically connected to a first scanning signal line, a first electrode of the first switching sub-transistor is electrically connected to a first node, a first electrode of the second switching sub-transistor is electrically connected to a resetting signal line, and a second electrode of the first switching sub-transistor and a second electrode of the second switching sub-transistor are both electrically connected to a fourth node;

a gate of the driving transistor is electrically connected to the first node, and a first electrode of the driving transistor is electrically connected to a first power supply line;

gates of the third switching sub-transistor and the fourth switching sub-transistor are both electrically connected to a second scanning signal line, a first electrode of the third switching sub-transistor is electrically connected to the first node, and a first electrode of the fourth switching sub-transistor is electrically connected to a second electrode of the driving transistor, and a second electrode of the third switching sub-transistor and a second electrode of the fourth switching sub-transistor are both electrically connected to a third node;

the storage capacitor is electrically connected to the first power supply line and the first node respectively;

a first end of the first compensation capacitor is electrically connected to the first power supply line, and a second end of the first compensation capacitor is electrically connected to the third node;

a first end of the second compensation capacitor is electrically connected to the resetting signal line, and a second end of the second compensation capacitor is electrically connected to the fourth node;

the first compensation capacitor and the second compensation capacitor are used to enable a voltage Vn1' of the first node to be smaller than a voltage Vn3' of the third node and larger than a voltage Vn4' of the fourth node in a light-emitting stage;

wherein the pixel circuit further comprises an active layer, a first gate metal layer, a second gate metal layer and a source-drain metal layer;

the first end of the first compensation capacitor is the first power supply line located in the source-drain metal layer, the second end of the first compensation capacitor is arranged in a same layer as a conductive region of the active layer, the first gate metal-layer, or the second gate metal layer.

11. The display apparatus according to claim 10, wherein the pixel circuit further comprises: a second data writing switching transistor, a second resetting switching transistor, a first light-emitting control switching transistor, a second light-emitting control switching transistor and a light-emitting device; wherein, a gate of the second data writing switching transistor is electrically connected to the second scanning signal line, a first electrode of the second data writing switching transistor is electrically connected to a data signal line, and a second electrode of the second data writing switching transistor is electrically connected to the first electrode of the driving transistor;

a gate of the second resetting switching transistor is electrically connected to the first scanning signal line, a first electrode of the second resetting switching transistor is electrically connected to the resetting signal line, a second electrode of the second resetting switching transistor is electrically connected to an anode of the light-emitting device, and a cathode of the light-emitting device is electrically connected to a second power supply line;

a gate of the first light-emitting control switching transistor is electrically connected to a light-emitting control signal line, a first electrode of the first light-emitting control switching transistor is electrically connected to the first electrode of the driving transistor, and a second electrode of the first light-emitting control switching transistor is electrically connected to the first power supply line; and a gate of the second light-emitting control switching transistor is electrically connected to the light-emitting control signal line, a first electrode of the second light-emitting control switching transistor is electrically connected to the second electrode of the driving transistor, and a second electrode of the second light-emitting control switching transistor is electrically connected to the anode of the light-emitting device.

12. The display panel according to claim 9, wherein the first compensation capacitor and the second compensation capacitor are used to enable a difference between the voltage Vn3' of the third node and the voltage Vn1' of the first node is equal to a difference between the voltage Vn1' of the first node and the voltage Vn4' of the fourth node in the light-emitting stage.

13. The display panel according to claim 12, wherein in the light-emitting stage:

$$Vn3'=(Vdt+Vth)+C(3/(C3+C1+C_{n3\text{-}other})*\Delta V_{Sn};$$

$$Vn4'=V_{init}+C4/(C4+C2+C_{n4\text{-}other})*\Delta V_{Sn-1};$$

$$Vn1'=(Vdt+Vth)+C_{n1\text{-}sn}/(Cst+2*Cgd+C_{n1\text{-}other})*\Delta V_{Sn}+(C_{n1\text{-}n5}+Cgd)/(Cst+2*Cgd+C_{n1\text{-}other})*\Delta V_{n5};$$

wherein, Vdt is a data voltage, Vth is a threshold voltage of the driving transistor, C3 is a parasitic capacitance between the third node and the second scanning signal line, C4 is parasitic capacitance between the fourth node and the first scanning signal line, C1 is a capacitance value of the first compensation capacitor, C2 is a capacitance value of the second compensation capacitor, $C_{n3\text{-}other}$ is a parasitic capacitance between the third node and another signal line, $C_{n4\text{-}other}$ is a parasitic capacitance between the fourth node and another signal line, $C_{n1\text{-}other}$ is a parasitic capacitance between the first node and another signal line, and $V_{init}$ is a resetting voltage on the resetting signal line, $\Delta V_{Sn}$ is a voltage difference on the second scanning signal line, $\Delta V_{Sn-1}$ is a voltage difference on the first scanning signal line, Cst is a capacitance value of the storage capacitor in the pixel circuit, $C_{n1\text{-}sn}$ is a parasitic capacitance between the gate of the driving transistor and the second scanning signal line, Cgd is a channel capacitance of the driving transistor, and $C_{n1\text{-}n5}$ is capacitance between the first node and the second electrode of the driving transistor, and $\Delta V_{n5}$ is a voltage difference between voltages of the second electrode of the driving transistor in the light-emitting stage and before the light-emitting stage.

14. The display panel according to claim 10, wherein Vn1' is a fixed value, and the capacitance value of the first compensation capacitor C1 and the capacitance value of the second compensation capacitor C2 are determined based on Vn3'>Vn1'>Vn4'.

15. The display panel according to claim 9, wherein the first end of the second compensation capacitor is connected to the resetting signal line located in the second gate metal layer, and the second end of the second compensation capacitor is arranged in a same layer as the conductive region of the active layer, the first gate metal layer or the source-drain metal layer.

16. The display panel according to claim 15, wherein the second end of the first compensation capacitor and the second end of the second compensation capacitor are arranged in a same layer; and
the second end of the first compensation capacitor is arranged in a same layer as the first gate metal layer or the second gate metal layer, the second end of the first compensation capacitor is electrically connected to the third node through a via hole, and the second end of the second compensation capacitor is electrically connected to the fourth node through a via hole.

17. The display panel according to claim 9, wherein the pixel circuit further comprises: a second data writing switching transistor, a second resetting switching transistor, a first light-emitting control switching transistor, a second light-emitting control switching transistor and a light-emitting device; wherein, a gate of the second data writing switching transistor is electrically connected to the second scanning signal line, a first electrode of the second data writing switching transistor is electrically connected to a data signal line, and a second electrode of the second data writing switching transistor is electrically connected to the first electrode of the driving transistor;

a gate of the second resetting switching transistor is electrically connected to the first scanning signal line, a first electrode of the second resetting switching transistor is electrically connected to the resetting signal line, a second electrode of the second resetting switching transistor is electrically connected to an anode of the light-emitting device, and a cathode of the light-emitting device is electrically connected to a second power supply line, a gate of the first light-emitting control switching transistor is electrically connected to a light-emitting control signal line, a first electrode of the first light-emitting control switching transistor is electrically connected to the first electrode of the driving transistor, and a second electrode of the first light-emitting control switching transistor is electrically connected to the first power supply line; and a gate of the second light-emitting control switching transistor is electrically connected to the light-emitting control signal line, a first electrode of the second light-emitting control switching transistor is electrically connected to the second electrode of the driving transistor, and a second electrode of the second light-emitting control switching transistor is electrically connected to the anode of the light-emitting device.

18. The display panel according to claim 17, wherein the driving transistor and all switching transistors are P-type transistors or N-type transistors.

* * * * *